United States Patent [19]
Togashi

[11] Patent Number: 5,745,364
[45] Date of Patent: Apr. 28, 1998

[54] METHOD OF PRODUCING SEMICONDUCTOR WAFER

[75] Inventor: Yoichi Togashi, Yamagata, Japan

[73] Assignee: NEC Corporation, Tokyo, Japan

[21] Appl. No.: 578,027

[22] Filed: Dec. 26, 1995

[30] Foreign Application Priority Data

Dec. 28, 1994 [JP] Japan ................................ 6-327885

[51] Int. Cl.⁶ .................................................. G06F 19/00
[52] U.S. Cl. .............................. 364/468.28; 364/468.07
[58] Field of Search .......................... 364/468.28, 468.05, 364/468.06, 468.07, 468.08, 468.13, 468.14, 478.01; 395/207, 208, 228; 705/7–11

[56] References Cited

U.S. PATENT DOCUMENTS

| 4,459,663 | 7/1984 | Dye | 364/468.06 X |
| 5,170,355 | 12/1992 | Hadavi et al. | 364/468.09 |
| 5,282,139 | 1/1994 | Kobayashi | 364/468.07 |
| 5,341,302 | 8/1994 | Connors et al. | 364/468.08 |
| 5,375,061 | 12/1994 | Hara et al. | 364/468.07 |
| 5,402,350 | 3/1995 | Kline | 364/468.07 |

Primary Examiner—Joseph Ruggiero
Attorney, Agent, or Firm—Sughrue, Mion, Zinn, Macpeak & Seas, PLLC

[57] ABSTRACT

A system for producing a semiconductor wafer includes a production progress comparing/calculating unit, a fabrication device status monitor step, an inventory control step, and a process shelf controller step. In response to a timing signal from the fabrication device status monitor step, the production progress comparing/calculating unit determines a semiconductor wafer to be processed next, and the determined semiconductor wafer is automatically searched for on a process shelf. The fabrication devices of a semiconductor wafer production line start processing semiconductor wafers at suitable times thereby producing semiconductor wafers according to a production plan and meeting a delivery time for the semiconductor wafers.

4 Claims, 4 Drawing Sheets

METHOD OF PRODUCING SEMICONDUCTOR WAFER

BACKGROUND OF THE INVENTION

1. Field of the Invention

The present invention relates to a method of producing a semiconductor wafer, and more particularly to a method of controlling the production process of a semiconductor wafer production line which is composed of many processing steps.

2. Description of the Related Art

Semiconductor wafer production lines are composed of a large number of fabrication steps, ranging from about 300 to 500 fabrication steps, and each of the fabrication steps is carried out by a fabrication device which is very expensive. Therefore, fabrication devices are not arranged in a row along the fabrication procedure, but arranged in such a job shop system that one fabrication device is repeatedly used in different fabrication steps for processing a semiconductor wafer successively through fabrication steps. In the description of the specification, a lot of semiconductor wafers also will be referred to as a semiconductor wafer.

Therefore, a plurality of semiconductor wafers are brought into process in each of the fabrication devices of a semiconductor wafer production line regardless of the order in which they are fed into the semiconductor wafer production line. Semiconductor wafers that are brought into process in each of the fabrication devices have different delivery times, depending on the kinds thereof. Thus it may occur, by chance, that a semiconductor wafer immediately after it is fed into a semiconductor wafer production line and a semiconductor wafer immediately before it is put into a warehouse are brought into the same process shelf for a fabrication device.

A conventional process of determining the feeding order in which a semiconductor wafer is processed with highest priority among a plurality of semiconductor wafers that have been brought into process in one fabrication device will be described below with reference to FIG. 1 of the accompanying drawings. In order, for an operator, to feed the next semiconductor wafer into a fabrication device, the operator confirms whether the fabrication device is in a condition ready for processing semiconductor wafers, in step 1. If the fabrication device is processing a semiconductor wafer, then the operator estimates, based on his experience and skill, the time required for finishing the processing of the semiconductor wafer, in step 2. Then, the operator moves to a process shelf, in step 3, and asks a production controller about which semiconductor wafer on the process shelf is to be processed next, in step 4. The production controller determines which semiconductor wafer is to be processed with highest priority based on a production plan that has been produced and inputted, and based on a production achievement that has been made based on the production plan, and indicates the determined semiconductor wafer to the operator, in step 5. According to the indication from the production controller, the operator searches the process shelf for a semiconductor wafer to be processed, in step 6, and then starts processing the semiconductor wafer in the fabrication device, in step 7.

As described above, a semiconductor wafer to be processed next can be determined only after the operator has asked the production controller which wafer is to be processed next. Therefore, the time at which a semiconductor wafer to be processed next is determined varies, depending on the skill, experience of an operator. This poses the following problems:

(A) If a semiconductor wafer to be processed next is determined too early, then a semiconductor wafer that is indicated by the production controller to be processed next is temporarily stocked in the process shelf for the fabrication device, and will be processed by the fabrication device after the fabrication device becomes ready for processing the semiconductor wafer. In the event that, while a semiconductor wafer that is indicated by the production controller to be processed next is being temporarily stocked in the process shelf, another semiconductor wafer which is to be processed in preference to the temporarily stocked semiconductor wafer is brought into the process shelf, this semiconductor wafer cannot be processed prior to the temporarily stocked semiconductor wafer because the temporarily stocked semiconductor wafer has already been determined as a semiconductor wafer to be processed next. Therefore, the closer the subsequent semiconductor wafer to be processed preferentially to the temporarily stocked wafer is to a final step of fabrication, the more difficult it is to keep the delivery time of the subsequent semiconductor wafer.

(B) If a semiconductor wafer to be processed next is determined too late, then the idle time of the fabrication device increases, and rate of operation of the fabrication device decreases. Therefore, the number of semiconductor wafers processed by the fabrication device is reduced, and a target production quantity cannot be reached.

The operator searches the process shelf for a semiconductor wafer to be processed based on the semiconductor wafer number indicated by the production controller. This procedure is disadvantageous as follows:

(C) As more semiconductor wafers are stocked on the process shelf for the fabrication device, it takes the operator more time to find a semiconductor wafer to be processed, therefore the idle time of the fabrication device increases, resulting in a reduction in the rate of operation of the fabrication device.

(D) As more semiconductor wafers are stocked on the process shelf for the fabrication device, the operator is more likely to find and process a semiconductor wafer whose number is different from the semiconductor wafer number indicated by the production controller, and hence it is more likely to fail to meet the delivery time for the semiconductor wafer indicated by the production controller.

SUMMARY OF THE INVENTION

It is therefore an object of the present invention to provide a method of producing a semiconductor wafer by determining, at a suitable time, a semiconductor wafer to be processed next by a fabrication device, and by searching for a determined semiconductor wafer not through an operator's direct visual inspection thereby reducing disturbance on a production plan, allowing semiconductor wafers to be produced according to a production plan that has been made before semiconductor wafers are fed into a semiconductor wafer production line.

According to the present invention, there is provided a method of producing a semiconductor wafer, including a system having a production progress comparing/calculating unit for comparing a production plan which has been prepared in advance and a production achievement, and for calculating a production progress, a fabrication device status monitor unit for monitoring processing statuses of fabrication devices, an inventory control unit for controlling semiconductor wafers stocked on process shelves for fabrication devices, and a process shelf controlling unit for automatically searching the process shelves for a semiconductor wafer to be processed by the fabrication devices, wherein calculation of the production progress in the production progress comparing/calculating unit is started in response to a timing signal from the fabrication device status monitor unit, to determine a semiconductor wafer to be processed next, and the process shelf controlling unit automatically searches a process shelf for the determined semiconductor wafer. The step of automatically searching may include the step of automatically delivering the semiconductor wafer out of the process shelf. The timing signal may be issued from the fabrication device status monitor unit when a loader of a fabrication device becomes empty.

According to the above method of producing a semiconductor wafer, since a semiconductor to be processed next by a fabrication device is determined by the production progress comparing/calculating unit in response to a timing signal from the fabrication device status monitor unit, it is possible to process, with good timing, a semiconductor wafer which is to be processed with the highest priority, and the rate of operation of the fabrication devices are rendered constant. Since a semiconductor wafer which is to be processed with the highest priority is automatically searched for, there is no searching mistake which would otherwise happen if the operator searched for the semiconductor wafer through a direct visual inspection. Consequently, it is possible to produce semiconductor wafers according to a production plan.

The above and other objects, features, and advantages of the present invention will become apparent from the following description with reference to the accompanying drawings which illustrate an example of the present invention.

DETAILED DESCRIPTION OF THE PREFERRED EMBODIMENT

Figure 4:
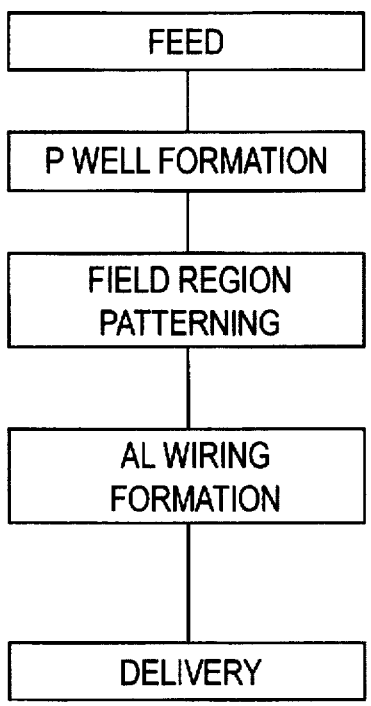
FIG. 4 is a flowchart of a processing sequence of the method of producing a semiconductor wafer according to the present invention.
Figure 5:
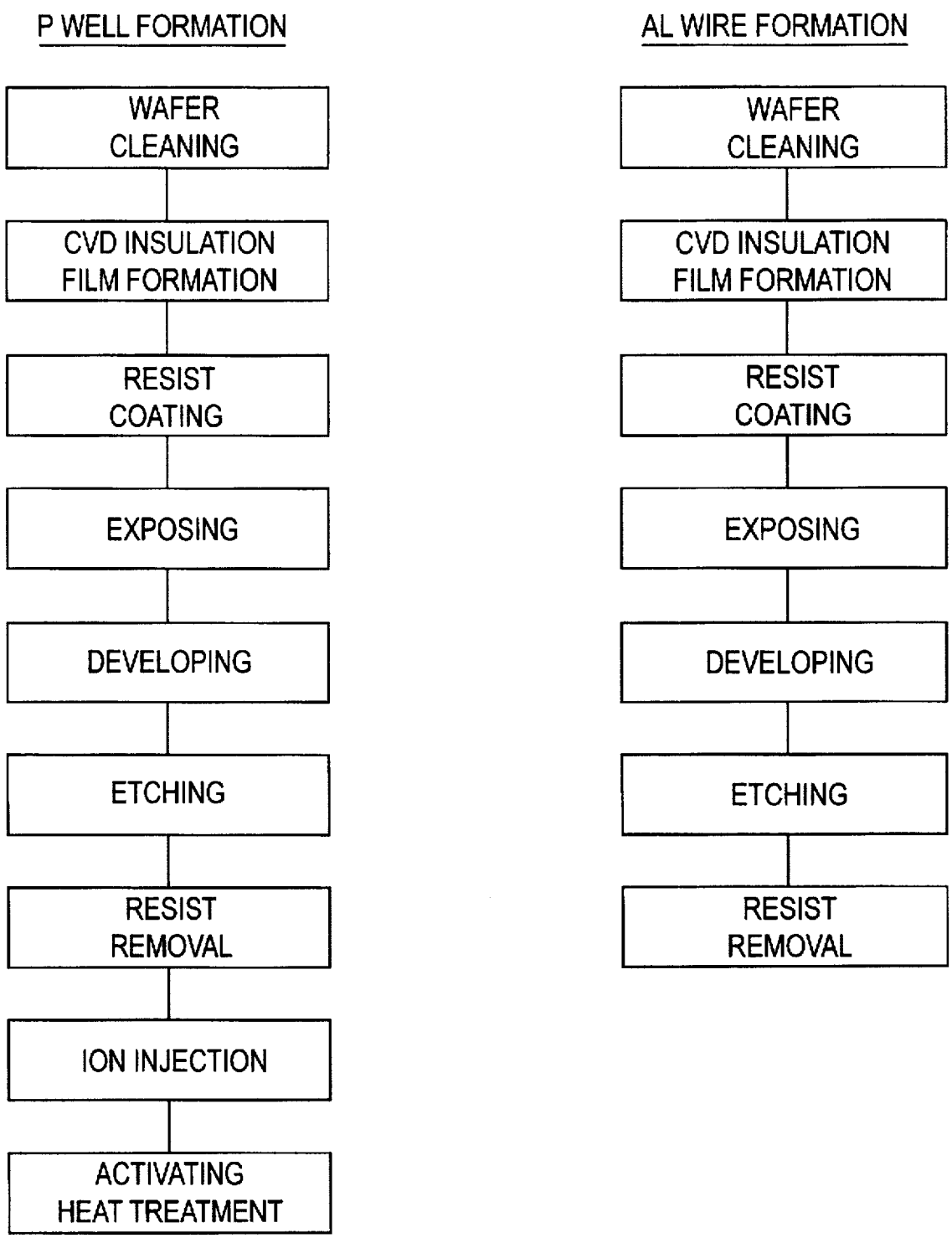
FIG. 5 is a flowchart of some steps of the processing sequence shown in FIG. 4.

FIG. 4 shows a processing sequence of a method of producing a semiconductor wafer according to the present invention, and FIG. 5 shows some steps of the processing sequence shown in FIG. 4.

As shown in FIG. 4, immediately after a semiconductor wafer is fed into a semiconductor wafer production line, a P well is formed in the semiconductor wafer, and then a field region is formed in the semiconductor wafer. Then, after various regions are formed in the semiconductor wafer, an aluminum wiring pattern is formed on the semiconductor wafer, and the processed semiconductor wafer is placed in a warehouse.

As shown in a left column of FIG. 5, the P well is formed in the semiconductor wafer by cleaning the semiconductor wafer, growing an insulating film on the semiconductor wafer with CVD, coating a resist layer on the semiconductor wafer, exposing the resist layer, developing a pattern on the semiconductor wafer, etching the semiconductor wafer, removing the resist layer, injecting impurity ions into the semiconductor wafer, and heating the semiconductor wafer for activation.

As shown in a right column of FIG. 5, the aluminum wiring pattern is formed on the semiconductor wafer by conducting cleaning of wafer, sputtering aluminum, coating of resist, exposing, developing, etching, and removing of resist in respective fabrication devices.

As can be seen from FIG. 5, the same fabrication devices are used in the respective cleaning, coating, exposing, developing, etching, and removing steps in the formation of the P well immediately after a semiconductor wafer is charged into the semiconductor wafer production line and in the formation of an aluminum wiring pattern immediately before the processed semiconductor wafer is sent to a warehouse.

Therefore, the semiconductor wafer to be processed for the formation of the P well immediately after the semiconductor wafer is charged into the semiconductor wafer production line, and the semiconductor wafer to be processed for the formation of the aluminum wiring pattern immediately before the processed semiconductor wafer is sent to the warehouse are put on a process shelf for the same fabrication device in each of the above steps.

Figure 1:
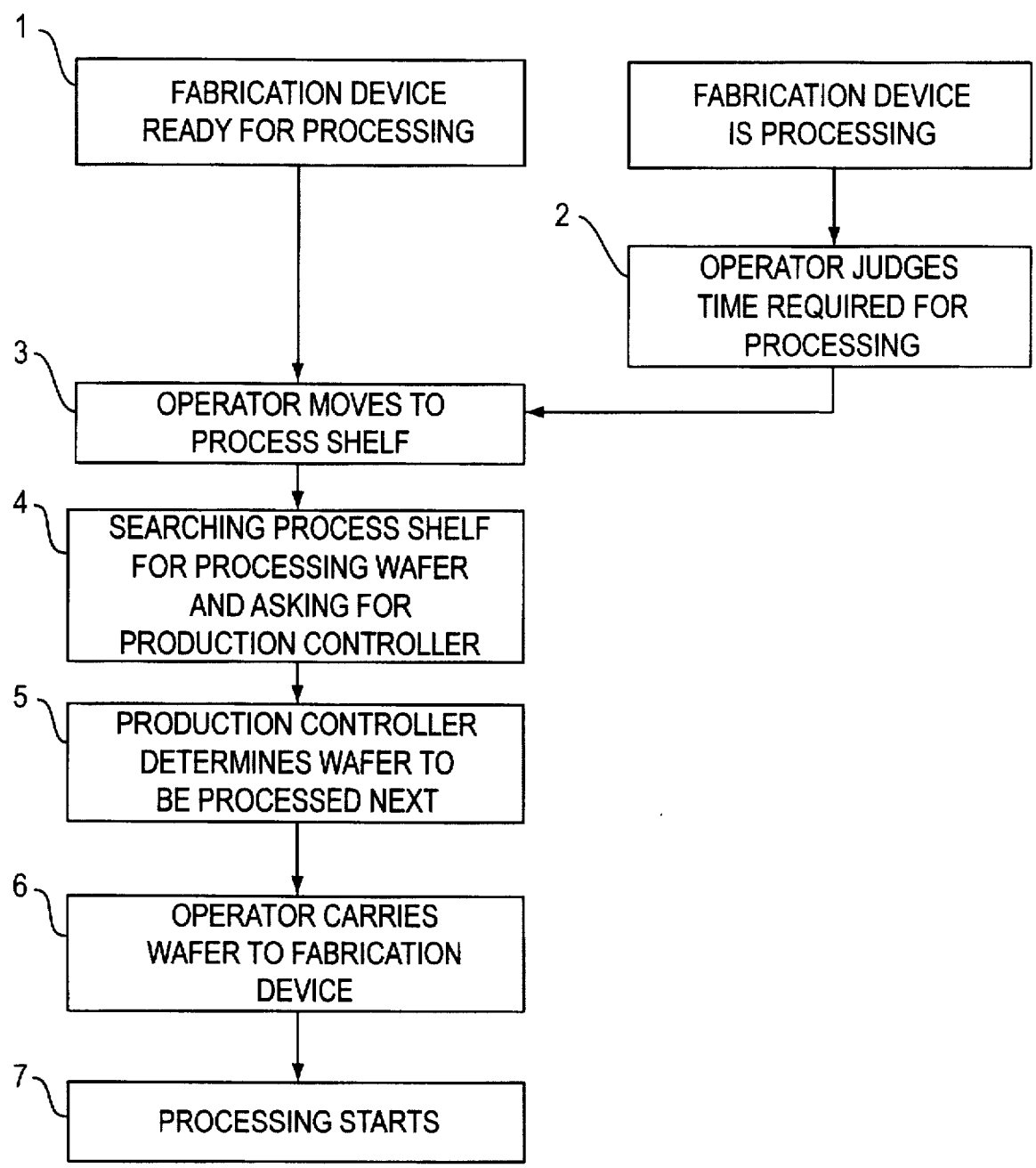
FIG. 1 is a block diagram showing a conventional process of producing a semiconductor wafer.
Figure 2:
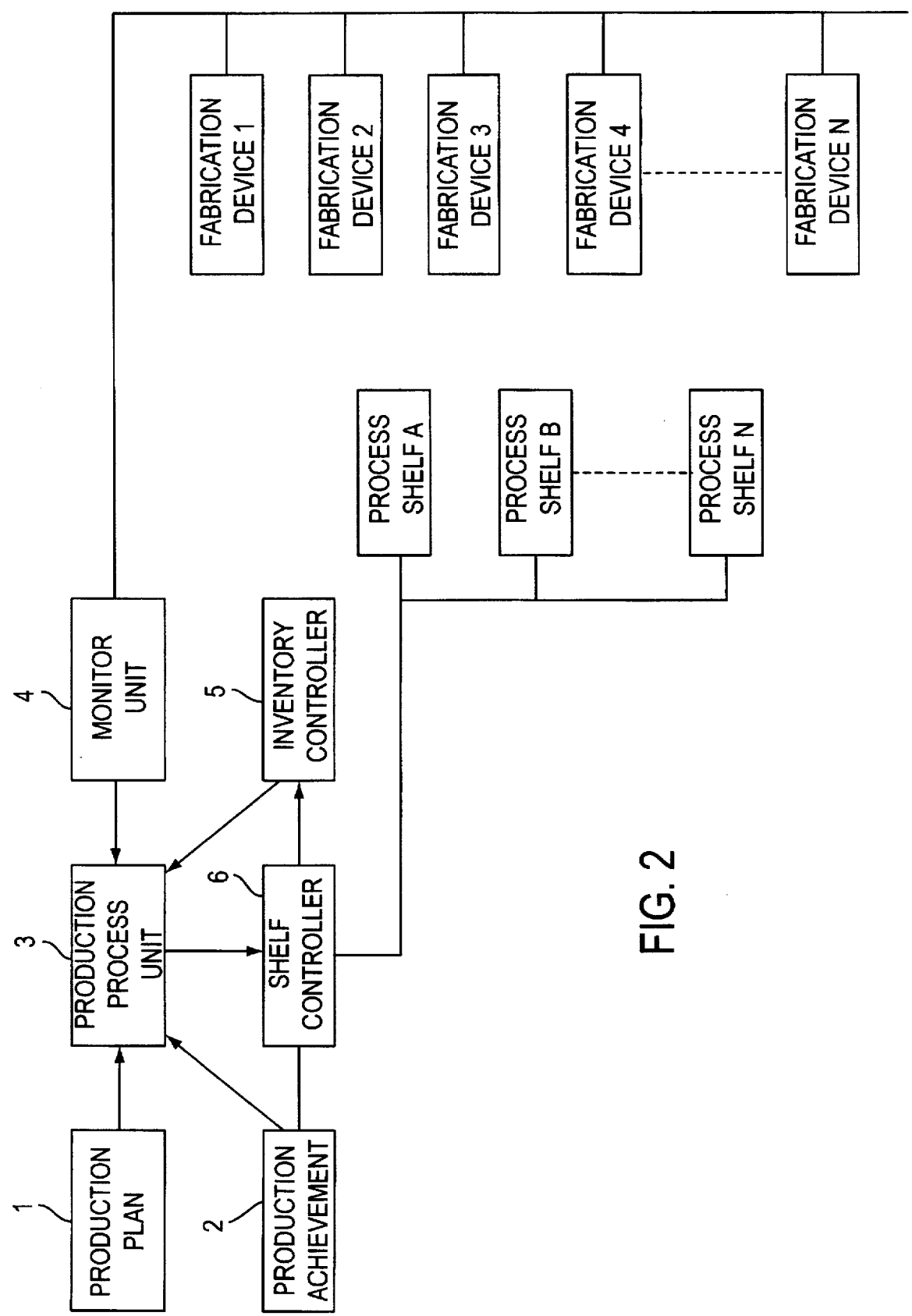
FIG. 2 is a block diagram of a system of producing a semiconductor wafer, the system being used to carry out a method of producing a semiconductor wafer according to the present invention.

FIG. 2 shows a system of producing a semiconductor wafer, the system being used to carry out the method of producing a semiconductor wafer according to the present invention. The system comprises a production progress comparing/calculating unit 3, for comparing a production plan 1 which has been prepared in advance and a production achievement 2 which has been made based on the production plan 1, and calculating a production progress based on the result of comparison, a fabrication device status monitor unit 4 for delivering a timing signal to the unit 3 to start calculating the production progress, an inventory control unit 5 for controlling semiconductor wafers put on process shelves for fabrication devices, and a process shelf controlling unit 6 for automatically searching the process shelves for semiconductor wafers that have been determined to be processed by the unit 3, delivering the determined semiconductor wafers from the process shelves, and instructing conveyors to carry the semiconductor wafers to the fabrication devices. These components of the system are all controlled by a computer.

Operation of the system at the time semiconductor wafers to be processed by the fabrication devices are stocked on the process shelves for the fabrication devices will be described below.

The fabrication device status monitor unit 4 detects when any one of the fabrication devices, which are being monitored, becomes capable of processing a semiconductor wafer, and when a loader of a fabrication device becomes empty and is capable of receiving another semiconductor wafer after a preceding semiconductor wafer has been transferred from the loader into a processing chamber of the fabrication device and is being processed in the processing chamber. At the time the fabrication device status monitor unit 4 detects one of the above conditions, the unit 4 records information representing that the fabrication device is capable of processing a semiconductor wafer or information representing that a semiconductor wafer can be placed in the loader of the fabrication device, and gives a timing signal to the unit 3 to start calculating a production progress.

The production progress comparing/calculating unit 3 extracts, from the inventory control unit 5, data of semiconductor wafers that are put in the process shelf for the fabrication device, and determines whether the semiconductor wafers can be processed under the present conditions of the fabrication device or not. The unit 5 handles data for semiconductor wafers that are put in the process shelf for the fabrication device. For example, if a processing condition for the semiconductor wafers that are put in the process shelf for the fabrication device indicates oxidization at 1000° C., then the unit 3 judges whether the fabrication device, in the form of an oxidizing furnaces is presently at a temperature of 1000° C. or not.

If the present condition of the fabrication device is capable of processing the semiconductor wafers on the process shelf, then the unit 3 calculates how much the production progress is behind or ahead of the production plan 1 based on the production plan 1 and the production achievement 2. A specific calculation process will be described later with reference to FIG. 3.

Based on the calculated results the production progress comparing/calculating unit 3 determines a semiconductor wafer to be processed with highest priority among the semiconductor wafers on the process shelf, instructs the process shelf controller 6 to deliver the determined semiconductor wafer out of the process shelf, and indicates a destination of the determined semiconductor wafer to the operator or the conveyor robot. Thereafter, the fabrication device status monitor unit 4 confirms that the fabrication device is in a condition capable of processing semiconductor wafers. The process shelf controller 6 automatically searches the process shelf for the indicated semiconductor wafer. The located semiconductor wafer is automatically delivered out of the process shelf by a robot controlled by the process shelf controller 6. The semiconductor wafer that has been automatically delivered out of the process shelf is then conveyed to the fabrication device by the conveyor robot. Alternatively, the semiconductor wafer that has been automatically delivered out of the process shelf is carried to the fabrication device by an operator based on an instruction which is displayed on a display panel or the like as to the destination fabrication device.

A process of automatically searching the process shelf for the indicated semiconductor wafer will be described below.

When semiconductor wafers are put on the process shelf, the process shelf controller 6 stores the positions and IDs of the semiconductor wafers based on ID codes such as bar codes or the like which are applied to boxes housing the semiconductor wafers. Then, the process shelf controller 6 searches the process shelf for the indicated semiconductor wafer based on the position and ID thereof which are indicated by the production progress comparing/calculating unit 3.

If there is a semiconductor wafer stocked on the process shelf for the fabrication device but the fabrication device does not satisfy a processing condition for the semiconductor wafer, then the system operates as follows: For example, if it is assumed that the semiconductor wafer put on the process shelf for the fabrication device has a processing condition for oxidization at 1000° C., and the fabrication device is in an oxidizing atmosphere at 900° C. When the fabrication device status monitor unit 4 recognizes that the fabrication device has been brought into a condition capable of processing the semiconductor wafer, i.e., its temperature is switched into and held at 1000° C., the unit 4 indicates the recognized condition to the unit 3. The unit 3 extracts process information from the inventory control unit 5, and determines a semiconductor wafer to be processed with highest priority among those semiconductor wafers which are to be oxidized at 1000° C. The semiconductor wafer to be processed with highest priority is determined in the same manner as described above.

If a semiconductor wafer which needs to be oxidized at 900° C. is put on the process shelf for the fabrication device which is kept at 900° C., then it is the general practice to process this semiconductor wafer before the temperature of the fabrication device is changed because it takes some time to change the temperature of the fabrication device.

Even when no semiconductor wafer is put on the process shelf for the fabrication device, the fabrication device status monitor unit 4 keeps monitoring the fabrication device which is in a condition capable of processing semiconductor wafers. When the process shelf controller 6 recognizes that a semiconductor wafer capable of being processed by the fabrication device is put on the process shelf therefor, the process shelf controller 6 indicates the recognized condition to the production progress comparing/calculating unit 3. The unit 3 extracts process information of the semiconductor wafer on the process shelf from the inventory control unit 5. If the process information of semiconductor wafer complies with the present processing condition of the fabrication device, then the unit 3 instructs the process shelf controller 6 to deliver the semiconductor wafer out of the process shelf.

The calculation process for calculating a production progress will be described below with reference to FIG. 3.

Figure 3:
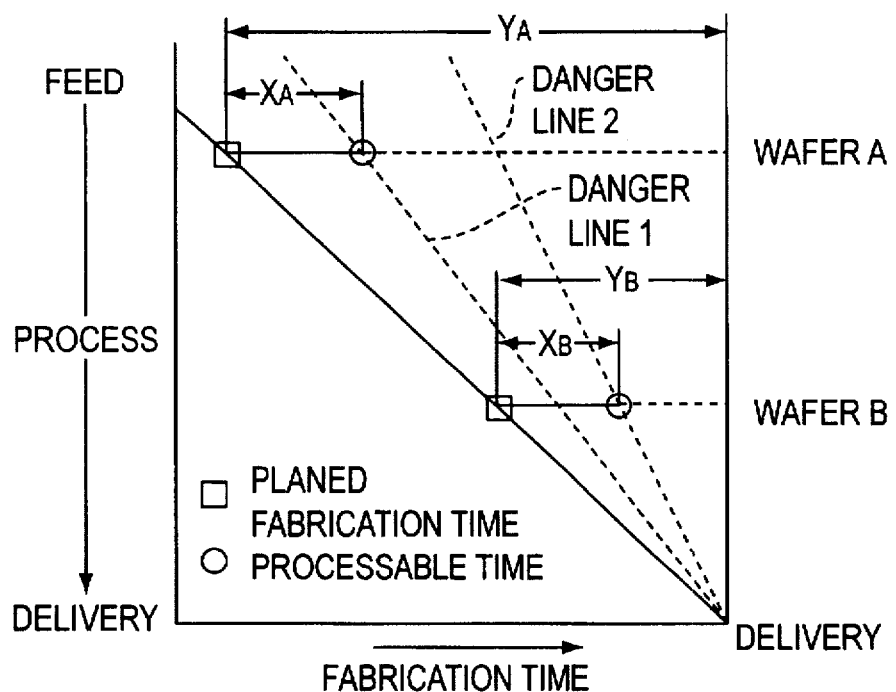
FIG. 3 is a diagram illustrative of a process of determining a semiconductor wafer to be processed according to the present invention.

In FIG. 3, semiconductor wafers A, B are put on the process shelf for one fabrication device so as to be processed under the same condition. When the fabrication device becomes ready for processing semiconductor wafers, it can process both the semiconductor wafers A, B.

The production progress comparing/calculating unit 3 extracts a production plan prepared in advance for all semiconductor wafers to be processed and a production achievement in order to calculate a production progress with respect to the semiconductor wafers on the process shelf.

With respect to the semiconductor wafer A, a delay time, which is the difference between a planned fabricating time (indicated by square as shown in FIG. 3) according to the production plan and a processable time (indicated by circle as shown in FIG. 3), is indicated by $X_A$, and a time from the planned fabricating time to a delivery time is indicated by $Y_A$.

With respect to the semiconductor wafer B, a delay time, which is the difference between a planned fabricating time (indicated by square) according to the production plan and a processable time (indicated by circle), is indicated by $X_B$, and a time from the planned fabricating time to a delivery time is indicated by $Y_B$. Which one of the semiconductor wafers A, B is to be processed in preference to the other is determined by dividing the delay time by the remaining time up to the delivery time. It can be understood that the greater the solution (A=X/Y) or the quotient, the more difficult it is to meet the delivery time.

For the semiconductor wafer A, $A_A = X_A/Y_A$, and the present status thereof, i.e., the processable time (circle), is on a danger line 1.

For the semiconductor wafer B, $A_B = X_B/Y_B$, which is greater than $A_A$ for the semiconductor wafer A, and the present status thereof, i.e., the processable time (circle), is on a danger line 2 which is steeper than the danger line 1. This indicates that it is necessary to process the semiconductor wafer B in preference to the semiconductor wafer A.

Consequently, it is possible to meet the delivery line by processing the semiconductor wafer B in preference to the semiconductor wafer A.

In the above processing sequence, the production plan 1 supplies the production progress comparing/calculating unit 3 with a planned fabricating time, a planned delivery time, a planned processing time, and a planned conveying time. The production achievement 2 supplies the unit 3 with starting and ending times of a processing step and a conveying time. The processable time is the sum of a calculated starting time, i.e., a time for the fabrication device status monitor unit 4 to output a semiconductor wafer discharge request to the unit 3, a planned conveying time, and a planned preparing time.

The present invention will yield the following advantages:

When a fabrication device is capable of processing a semiconductor wafer or when a loader of a fabrication device is capable of holding a semiconductor wafer, the fabrication device status monitor unit delivers a signal to the production progress comparing/calculating unit to determine a semiconductor wafer to be processed next. The semiconductor wafer is automatically searched for on the process shelf, rather than by an operator who searches for the semiconductor wafer through a direct visual inspection. Accordingly, semiconductor wafers can be produced according to a production plan, and the delivery time for the semiconductor wafers can be met.

Since a semiconductor wafer to be processed next is determined by a request from a fabrication device and processed by the fabrication device, the rate of operation of the fabrication devices is rendered constant.

While a preferred embodiment of the present invention has been described using specific terms, such description is for illustrative purposes only, and it is to be understood that changes and variations may be made without departing from the spirit or scope of the following claims.

What is claimed is:

1. A method of producing a semiconductor wafer comprising the steps of:

(a) a production process comparing/calculating step for comparing a production plan, which has been prepared in advance, with production achievement data, and subsequently calculating a production progress, (b) a fabrication device status monitor step for monitoring the processing status of fabrication devices, (c) an inventory control step for controlling semiconductor wafers that have been placed on process shelves to be processed in said fabrication devices, and, (d) a process shelf controller step for automatically searching said process shelves for a next semiconductor wafer to be processed by said fabrication devices, whereby calculation of said production progress of step (a) is started in response to a timing signal from step (b), said production progress being used to determine said next semiconductor wafer to be processed, such that step (d) enables the searching of said process shelves for said next semiconductor wafer, wherein if more than one suitable candidate for said next semiconductor wafer is located on the process shelves for said fabrication device, a priority determination is made whereby a ratio is calculated for each candidate wafer and the candidate wafer with the largest corresponding ratio is given highest priority and the candidate wafer with the smallest ratio is given lowest priority, all candidate semiconductor wafers with intermediate ratios being given a priority accordingly, said ratio being calculated by dividing the difference between actual process time for the wafer, including fabrication device set up time, and the planned process time, given by said production plan, by the difference between the planned delivery time, also given by said production plan, and said planned process time.

2. A method according to claim 1, wherein step (d) includes the further step of automatically delivering the semiconductor wafer out of the process shelf.

3. A method according to claim 1, wherein steps (a), (b), (c) and (d) are controlled by a computer.

4. A method according to claim 1, wherein said timing signal is issued from the step (b) when a loader of a fabrication device becomes empty.

* * * * *